United States Patent [19]

Johnston, Jr.

[11] 3,982,265

[45] Sept. 21, 1976

[54] DEVICES CONTAINING ALUMINUM-V SEMICONDUCTOR AND METHOD FOR MAKING

[75] Inventor: Wilbur Dexter Johnston, Jr., Holmdel, N.J.

[73] Assignee: Bell Telephone Laboratories, Incorporated, Murray Hill, N.J.

[22] Filed: Sept. 19, 1975

[21] Appl. No.: 614,848

[52] U.S. Cl. ................................ 357/30; 357/16; 357/52; 204/56 R; 204/38 A; 204/35 R; 204/42; 204/35 N; 204/37 R; 204/32 S; 136/89

[51] Int. Cl.² .......................................... H01L 27/14

[58] Field of Search ..................... 357/16, 30, 52; 204/56 R, 35 R, 35 N, 37 R, 32 S, 43 R, 38 A, 42; 136/89

[56] References Cited

UNITED STATES PATENTS

| | | | |
|---|---|---|---|
| 3,218,205 | 11/1965 | Ruehrwein | 148/175 |
| 3,249,473 | 5/1966 | Holonyak, Jr. | 148/175 |
| 3,322,575 | 5/1967 | Ruehrwein | 136/89 |
| 3,364,084 | 1/1968 | Ruehrwein | 148/175 |
| 3,436,549 | 4/1969 | Pruett | 200/211 |
| 3,882,000 | 5/1975 | Schwartz | 204/38 A |
| 3,890,169 | 6/1975 | Schwartz | 148/187 |
| 3,914,465 | 10/1975 | Dyment | 427/82 |

OTHER PUBLICATIONS

Huber et al., Proc. 1973 IEEE Photovoltaic Conf., 1974, pp. 100–102.

Ettenberg et al., J. Electrochem. Soc., Solid State Science, vol. 118, No. 8, Aug. 1971, pp. 1355–1358.

Bolger et al., Nature, Sept. 28, 1963, p. 1287.

Bolger et al., Journal of the Electrochem. Soc., vol. 110, Dec. 1963, p. 2640.

*Primary Examiner*—Martin H. Edlow
*Attorney, Agent, or Firm*—James F. Hollander

[57] ABSTRACT

A high efficiency solar cell having n-type aluminum arsenide grown on a p-type gallium arsenide substrate and protected by a layer of anodic oxide. The aluminum arsenide is deposited by vapor phase epitaxy by reacting high purity arsine, hydrogen chloride and aluminum at approximately 1000°C in an all-alumina reactor tube system. The aluminum arsenide layer is protected from deterioration by first anodizing it in pure water and phosphoric acid at pH 2.0 with a current density of 2–8 milliamperes per square centimeter at room temperature. Second, the anodic oxide so formed is annealed at about 450°C for at least twenty minutes in dry nitrogen. The oxide layer also acts as an antireflective coating. A portion of the oxide layer is etched away to expose a region of the aluminum arsenide to which an electrical contact is applied. The other contact is made to the substrate.

14 Claims, 2 Drawing Figures

3,982,265

DEVICES CONTAINING ALUMINUM-V SEMICONDUCTOR AND METHOD FOR MAKING

BACKGROUND OF THE INVENTION

The present invention relates to devices for converting radiant energy into electricity and electricity into radiant energy, and methods of making them. More specifically, the present invention relates to such devices which contain a compound of aluminum with one or more elements from Group V of the periodic table. The invention also involves a method for preventing deterioration of such aluminum-V compounds.

Direct conversion of light into electrical energy by solar cells is important in outer space applications. New and better earthbound sources of electrical energy are in great demand as well. Long operating life, high efficiency at high temperatures, and low cost are important device goals in both environments.

Aluminum-V compounds such as aluminum arsenide have begun to be investigated for possible use in photovoltaic devices, including solar cells. These compounds have been expected to exhibit a high bandgap and provide a good lattice match with III–V compounds such as gallium arsenide, although operative heterojunctions of such a type, grown by vapor phase epitaxy, have not heretofore been demonstrated. Unfortunately, aluminum-V compounds are also known to react with water and water vapor, and deteriorate when left in the open air. These problems have been thought to limit the potential usefulness of such compounds in device applications. Now, however, these problems can be solved according to an invention herein disclosed.

SUMMARY OF THE INVENTION

In the present invention, a device for converting radiant energy to electricity having an exposed surface of an aluminum-V semiconductor compound subject to deterioration is protected by anodizing it with an electric current in a solution of essentially pure water suitably adjusted in pH with phosphoric acid ($H_3PO_4$). Instead of deteriorating in this water solution, the exposed surface rapidly becomes covered with a protective anodic aluminum-V oxide having a thickness of about 10A per volt applied. Growth is completed within minutes. The aluminum-V oxide layer is then annealed between 350°C and 520°C. In this manner aluminum-V photovoltaic devices can be protected from deterioration indefinitely. Moreover, the oxide acts as a quarter-wavelength antireflective coating when its thickness is such as to center the reflection minimum in the wavelength band of radiation incident thereon.

A further feature of the invention is a particular kind of device having the oxide layer just described. In this aspect of the invention, an aluminum-V semiconductor layer is for the first time able to be formed adjacent to a layer of III–V semiconductor of opposite conductivity type, producing a p-n junction at the metallurgical interface. The anodic oxide is subsequently applied to protect the aluminum-V layer. The III–V semiconductor is composed of one or more Group III and one or more Group V elements so that relative to the aluminum-V semiconductor an acceptable lattice match is obtained together with a significant bandgap difference. Incident radiation thereby passes through the higher bandgap layer and is absorbed near the junction in the lower bandgap layer.

By suitable doping of the layers, the quantum efficiency approaches 100 per cent and the overall power conversion efficiency of the device as a solar cell can exceed 17 per cent. The overall efficiency remains in a highly advantageous range even at high temperatures. Thus, solar cells according to the invention are eminently suitable for use in outer space and in terrestrial solar energy concentrator apparatus of a more economical type requiring less solar cell surface area as a consequence of higher conversion efficiency.

Relatively low-cost photovoltaic devices and power supply systems may be fabricated according to the invention for the additional reason that the aluminum-V layer is amenable to deposition over large surface areas by vapor phase epitaxial techniques. Consequently, the same energy-absorbing surface area is provided with fewer device units so that fewer costly interconnections between device units are required. The cost advantage is even greater because relatively inexpensive aluminum is solely employed in the aluminum-V layer to the exclusion of more costly Group III constituents.

The economy realized in fabricating the invention commends it for use as a photodetector and as a light-emitting diode in optical communications applications as well.

The invention will be more perfectly understood by reference to the appended drawings and the following description of certain specific embodiments thereof.

DETAILED DESCRIPTION OF THE DRAWINGS

Figure 1:
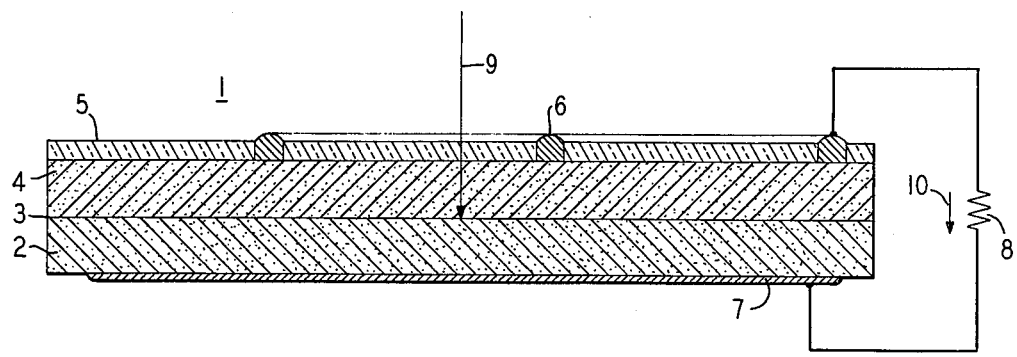
FIG. 1 shows a cross section of a solar cell according to the invention, for clarity drawn not necessarily to scale, and a schematic diagram of its connection to an electrical load.

FIG. 1 shows a solar cell 1 according to the present invention which exhibits high efficiency and long operating life. Gallium arsenide p-type substrate layer 2 underlies n-type aluminum arsenide layer 4 deposited adjacent thereto. A heterojunction 3 is formed at the metallurgical interface between the semiconductor layers 2 and 4. The n-type carrier concentration in layer 4 suitably exceeds about half the carrier concentration in the p-type substrate 2 and has a value of $n > 5 \times 10^{17}$ carriers per cubic centimeter for a quantum efficiency approaching 100 per cent. An anodic oxide coating layer 5 is produced on the aluminum arsenide layer 4 according to a method such as that described hereinbelow so that layer 4 is protected from deterioration for long periods of time. Since the anodic oxide of aluminum arsenide has a refractive index (1.8) which is approximately the square root of the refractive index (3.3) of aluminum arsenide itself, the oxide is advantageously utilized as an anti-reflective coating as well.

Electrical contacts 6 and 7 attached to layers 4 and 2 respectively are connected to a load resistor 8 or other suitable power consuming device. Thus, when incident light indicated by ray 9 impinges upon solar cell 1, it passes through the transparent anodic oxide layer 5 and high-bandgap aluminum arsenide layer 4 to be absorbed near the heterojunction 3, producing an electric current 10 in the load 8.

The n-type aluminum arsenide (AlAs) layer 4 is vapor phase epitaxially grown on a 400 microns thick, zinc-doped p-type gallium arsenide substrate wafer 2 by a hydrogen chloride (HCl) transport process similar to that described in the paper "Vapor Growth and Properties of AlAs" by M. Ettenberg, et al., *Journal of the Electrochemical Society*, Volume 118, No. 8, August 1971, pages 1355–1358.

High purity (99.999 per cent) aluminum is held in alumina boats in a horizontal alumina tube 4 feet long, 11/16 inch inside diameter, 1 inch outside diameter, through which 0.5 to 2 per cent anhydrous HCl by volume in hydrogen ($H_2$) carrier gas passes at 1000°–1100°C at about 450 cubic centimeters per minute. The aluminum is taken up and carried as a chloride through perforations in a closed end of the tube having 18 holes of 1/16 inch diameter. The stream formed thereby reacts with 1 to 2 per cent arsine ($AsH_3$) in $H_2$ carrier gas which passes thereto at about 500 cubic centimeters per minute along the outside of the alumina tube inside a larger 6 foot long alumina tube of 2 7/16 inches inside diameter. Gas-tight 99.8 per cent pure alumina components are used throughout. The aluminum arsenide which is formed is vapor phase epitaxially grown at constant temperature to a thickness of 3 to 40 microns to form the layer 4 on a cleaned crystallographic (100)-oriented gallium arsenide substrate wafer 2 illustratively having a carrier concentration $p = 1.5 \times 10^{18}$ and having its surface normal oriented at 0°–10° from the tube axis. Layers of approximately 20 microns thickness can be grown in one hour at a substrate temperature at 1030°C. The aluminum arsenide layers are found to be n-type with carrier concentrations varying from about $2 \times 10^{17}$ at a substrate temperature of 980°C to about $5 \times 10^{18}$ at 1100°C, a suitable value of $8 \times 10^{17}$ occurring at 1030°C.

It is important that contaminants be eliminated from the system. High purity reactants and use of high purity nonreacting structural components in the reaction zone are essential. A structure essentially devoid of fused silica and incorporating the all-alumina tubes described above may be advantageously employed in this regard. The alumina tubes are supported in a manner allowing for thermal expansion so that mechanical stresses and consequent breakage are avoided.

Figure 2:
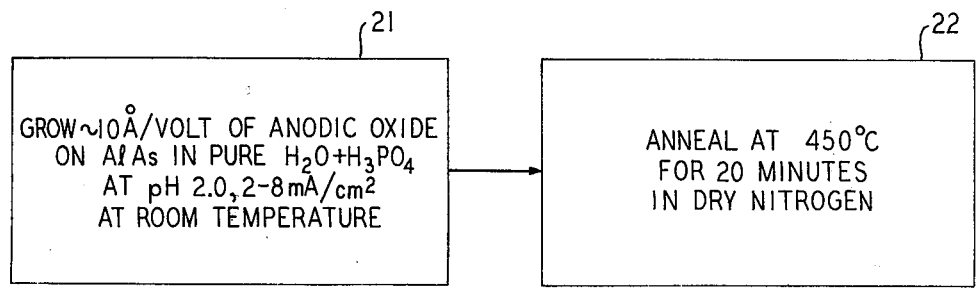
FIG. 2 is a flow diagram showing the steps of a preferred embodiment of the method aspect of the invention.

After vapor growth, the grown device having an exposed aluminum arsenide or other aluminum-V layer is removed from the reaction tube and placed in an anodization bath so that a protective anodic oxide coating may be applied as illustrated by step 21 of the method embodiment of the present invention depicted in FIG. 2. The bath of water is adjusted in pH with phosphoric acid ($H_3PO_4$). A pH in the range of 1 to 4 may be used; a pH of 1.5 to 2.5 is even better for AlAs; and a pH of about 2 is excellent for AlAs. The best value of pH in the 1 to 4 range depends on the composition of the aluminum-V compound to be anodized however. Uniformity of oxide growth on aluminum arsenide is found to be degraded if the bath is impure, particularly with respect to halide and nitrate ion concentrations, so that the use of a multiply filtered deionized type of water is preferable.

The anodization apparatus may be of a type familiar to the art wherein a source of electricity including a compliance voltage source and a current-limiting resistance is connected with its anode connected to the device to be anodized and with the cathode placed nearby in the electrolyte bath. See, for instance, U.S. Pat. No. 3,882,000 issued May 6, 1975 to B. Schwartz et al. Because aluminum arsenide is far more reactive in water than the gallium compounds discussed in said patent, the electric current should be caused to flow preferably within seconds after the aluminum arsenide device is placed in the electrolyte bath. The bath temperature may be any temperature up to about 70°C for which the bath is liquid. Room temperature may conveniently be used. It is found that the anodic oxide thickness obtained is about 10A per volt of compliance voltage available at the source of electric current. Thus, if a quarter wavelength anti-reflective coating of about 900A is to be grown, a compliance voltage of approximately 90 volts is suitable. Layer quality is excellent when the current density employed is 2 to 8 milliamperes per square centimeter of surface to be anodized. Growth of oxide layers up to 2500A occurs within minutes. The oxide so formed is believed to be a hydrated glass involving a mixture of oxides of aluminum and arsenic ($Al_2O_3$ and $As_2O_3$), although the invention is not meant to be limited by this chemical characterization.

After the anodically oxidized device is removed from the electrolyte bath, the anodic oxide coating layer is annealed as illustrated by step 22 of FIG. 2, during which step the water of hydration is believed to be driven off from the glass. The annealing step 22 is effective at temperatures higher than about 350°C up to a limit which is approximately 520°C. At the upper temperature limit devitrification by loss of arsenic or other Group V component and consequent deterioration of the oxide coating on aluminum arsenide and other aluminum-V compounds may become evident. An annealing period of at least 20 minutes is suitable at 400°–450°C and two hours is ample at all temperatures in the effective range with a greater length of time doing little harm. An atmosphere of dry nitrogen may be provided, although any other atmosphere is suitable which is inert relative to the anodic oxide and essentially free of hydrogen, water vapor, or other hydrogen-containing compounds.

The anodic oxide applied according to the method of the present invention resists deterioration in contact with photo-resists, waxes, glycol phthalate and shellac-based cements, such as are used in device fabrication and which deteriorate unprotected aluminum arsenide in varying degrees.

Standard photolithographic techniques are employed in defining an area on the anodic oxide layer 5 of FIG. 1 and etching the oxide to expose the aluminum arsenide layer 4 so that a finger contact or other electrical contact 6 may be formed thereon. An etching dip in 2 per cent to 10 per cent hydrofluoric acid (HF) in water solution for approximately 2 seconds is suitable for removing the oxide layer 5 in the contact area without removing the underlying portion of the aluminum arsenide layer 4 as well.

Ohmic contact 6 is gold, nickel-tin, gold corresponding to the n-type conductivity of layer 4; and contact 7 is gold, zinc, gold corresponding to the p-type conductivity of layer 2. Contacts 6 and 7 are deposited by electroplating, then sintered at 450°C in dry nitrogen for a few minutes, and connected with indium solder to gold wire leads. Alternative contacting approaches familiar to the art may also be employed.

The scope of the present invention may be better understood by considering other embodiments comprehended by it as well.

A gallium arsenide layer incorporating a p-n homojunction beneath a p-aluminum arsenide window layer can be formed when n-type gallium arsenide is dipped in p-type aluminum arsenide in a liquid phase epitaxial growth process. See "GaAs Solar Cells with AlAs Windows," by D. Huber and K. Bogus, *Proceedings of 1973 IEEE Photovoltaic Specialists Conference*, 1974 at pp. 100–102. That structure can be part of an embodiment of the present invention having an anodic oxide layer formed on the p-aluminum arsenide window so as to provide long life and antireflective properties.

Other embodiments of the invention may be devised employing other III–V compounds besides gallium arsenide and other aluminum-V compounds besides aluminum arsenide. In such embodiments suitable bandgaps and a substantial lattice match are obtained by appropriate choice of compositions of the compounds to be used in the adjacent layers.

When used in conjunction with circuits well known in the art, the invention may be employed in reverse bias as a photodetector or in forward bias as a light emitter. Vapor phase epitaxial technique may be used to economically deposit the aluminum-V layer over a large surface area which is then anodized by the method disclosed hereinabove. The product may then be divided into many small-area devices having electrodes attached and suitable for use in optical communication applications.

Thus, the invention comprehends not only the illustrative embodiments disclosed hereinabove, but also a wide variety of other embodiments as well which may constructed according to the principles and methods set forth herein without departing from the spirit and scope of the present invention.

Accordingly, what is claimed is:

1. A p-n junction device comprising:
    a first layer including III–V semiconductor;
    a second layer including aluminum-V semiconductor; and
    a layer of aluminum-V oxide located on said second layer.

2. A device as claimed in claim 1 wherein said aluminum-V semiconductor has a Group V constituent comprising arsenic and said first and second layers are substantially lattice matched.

3. A device as claimed in claim 1 wherein said first layer includes gallium arsenide semiconductor.

4. A device as claimed in claim 1 wherein said second layer includes aluminum arsenide semiconductor.

5. A device as claimed in claim 4 wherein said second layer includes aluminum arsenide having an n-type carrier concentration and said first layer has a p-type carrier concentration in a portion adjacent to said second layer.

6. A device as claimed in claim 5 wherein the carrier concentration in said n-type aluminum arsenide exceeds in magnitude one-half the carrier concentration in the adjacent portion of said first layer.

7. A photovoltaic device comprising:
    a first layer including a III–V semiconductor;
    a second layer of aluminum-V semiconductor of conductivity type opposite to said first layer and disposed adjacent thereto; and
    a transparent protective coating located on said second layer.

8. A photovoltaic device as claimed in claim 7 wherein said coating is a layer of anodic oxide of said second layer.

9. A photovoltaic device as claimed in claim 7 wherein said second layer includes aluminum arsenide and said coating is an antireflective layer of anodized aluminum arsenide.

10. A photovoltaic device as claimed in claim 7 wherein
    said III–V semiconductor is gallium arsenide having a p-type carrier concentration;
    said aluminum-V semiconductor is aluminum arsenide having an n-type carrier concentration exceeding $5 \times 10^{17}$ and exceeding one half said p-type carrier concentration in magnitude; and
    said coating is a layer of anodic oxide of said second layer.

11. In a method of applying a protective coating to a device having an exposed layer of aluminum-V compound the steps of
    anodically oxidizing said aluminum-V compound in essentially pure water adjusted in pH with phosphoric acid and
    annealing the anodic oxide so formed at a temperature between 350°C and 520°C.

12. The method of claim 11 wherein said pH is between 1 and 4 and said oxidizing occurs in liquid having a temperature not greater than 70°C and
    said annealing occurs in an atmosphere inert relative to said anodic oxide.

13. The method of claim 11 wherein
    said compound is aluminum arsenide;
    said pH is between 1.5 and 2.5;
    said oxidizing occurs at room temperature at a current density between 2 and 8 milliamperes per square centimeter; and
    said annealing occurs at a temperature between 400° and 450°C for a period between 20 minutes and 2 hours in dry nitrogen.

14. A device capable of converting radiant energy into electrical energy constructed to include aluminum-V semiconductor having a protective coating produced by the method of claim 11.

* * * * *